Oct. 17, 1967 I. J. HIRST 3,348,163

REDUNDANT AMPLIFIER CIRCUIT

Filed Jan. 11, 1965

United States Patent Office 3,348,163
Patented Oct. 17, 1967

3,348,163
REDUNDANT AMPLIFIER CIRCUIT

Ian Johnson Hirst, London, England, assignor to International Standard Electric Corporation, New York, N.Y., a corporation of Delaware Filed Jan. 11, 1965, Ser. No. 424,613
Claims priority, application Great Britain, Jan. 16, 1964, 1,973/64
3 Claims. (Cl. 330—84)

ABSTRACT OF THE DISCLOSURE

Two sets of amplifiers are placed in parallel to form a system with input and output terminals of the system connecting into dividing networks. Cross connections are made between input terminals of amplifiers paired as successive stages of the system such that each amplifier in a stage normally carries substantially half of the total signal. The cross connections are arranged to enable one of the two parallel amplifiers in a stage to carry the entire signal in case the other amplifier breaks down.

This invention relates to amplifiers and in particular to amplifiers of improved reliability of operation.

In some amplifiers, for example in multi-channel communication systems, it is essential to reduce the probability of a shut-down in the event of component failure in a repeater amplifier.

According to the present invention there is provided an amplifier including at least two amplifying paths connected in parallel with each other, each path having an input and an output and having at least two stages of amplification, a feedback path common to the amplifying paths and a bridging impedance connecting an interstage coupling circuit in one amplifying path to a corresponding coupling circuit in another amplifying path.

Figure 1:
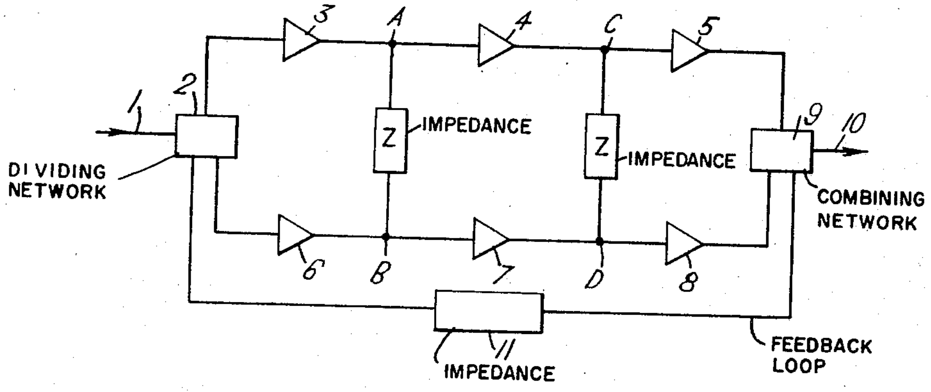
Figure 2:
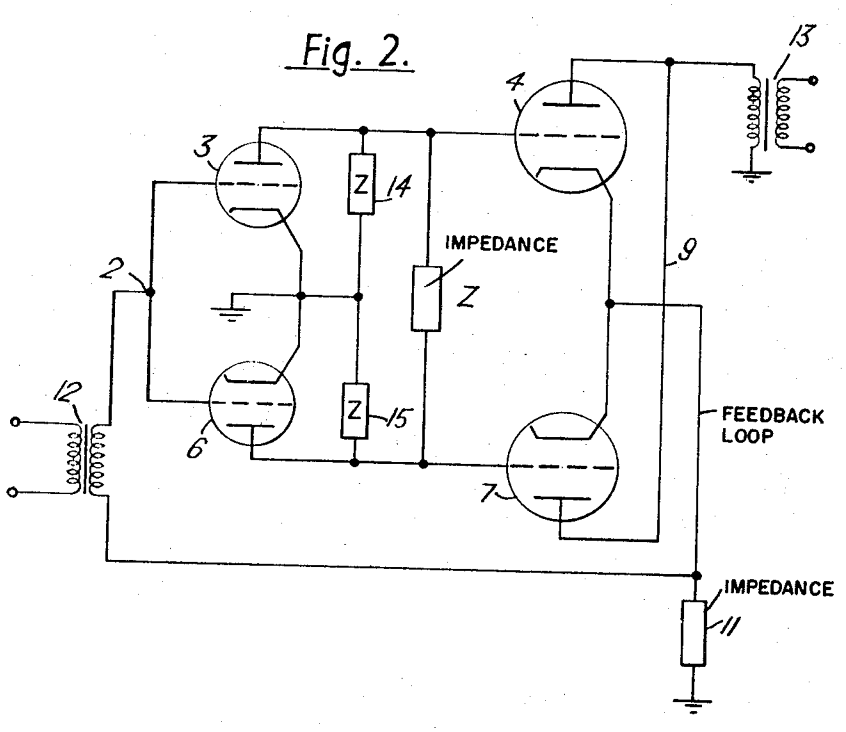

The invention will now be described with reference to the accompanying drawings in which:

FIG. 1 shows in block schematic form the essential features of amplifiers according to the invention, and FIG. 2 shows a simplified circuit of a preferred embodiment according to the invention.

The amplifier shown in FIG. 1 is provided with a signal to be amplified over lead 1. This signal is split by means of a dividing network 2, for example a transformer into two equal parts, which are applied to two amplifying paths, each of which may comprise two or more stages of amplification connected in tandem. The upper amplifying path is shown to comprise stages 3, 4 and 5 and the lower path similar stages 6, 7 and 8.

Each stage may use valves, transistors or other active elements which are provided in known ways with biasing potentials and interconnected by known coupling circuits to give the required electrical characteristics.

The outputs of the two amplifying paths are combined by network 9 and applied to the output lead 10. A feedback loop which includes an impedance 11 is connected between the output and input of the amplifier and is designed by known methods to give a gain frequency response of the required shape. In the figure the feedback path is shown to be connected to the amplifying paths over the networks 2 and 9. Feedback can of course be derived in other known ways, and may be applied over any number of stages provided each feedback loop is common to stages in both paths.

The amplifier stages in the upper and lower paths have similar characteristics. Under normal operating conditions they also carry signals of the same magnitude, so that points such as A and B or C and D have identical potentials and may therefore be connected by impedances Z without in any way affecting the performance of the amplifier.

If in the absence of impedance Z an amplifier stage in one of the branches becomes inoperative the whole branch will become inoperative with the result that the intermodulation performance will deteriorate.

If the impedance Z are provided, then in the event of a stage, for example 6 becoming inoperative, the stage following the defective one will obtain its input from stage 3 in the adjacent path thereby maintaining both output stages operative and thereby reducing intermodulation distortion as compared to the case in which no bridging impedances are used.

Although the above description referred to an amplifier incorporating two parallel paths, more paths, for example 3, can be provided to increase the reliability still further. In this case bridging impedances are provided between similar stages in each path.

If the value of the bridging impedance is made too large, its effectiveness as a bridge will be diminished. If on the other hand it is chosen too small, it will give less protection in the event of an interstage coupling circuit developing a short circuit to ground. A compromise must therefore be made and a convenient value of the bridging impedance is of the order of 2 to 3 times that of the total impedance to ground of the interstage coupling circuit.

A preferred arrangement of the amplifier according to the invention is shown in FIG. 2 which shows a two stage valve amplifier of simple design. In this one amplifying path comprises valve stages 3 and 4 and the other stages 6 and 7. The anode load impedances of the valves 3 and 6 are represented by impedances 14 and 15. The combining networks at the input and output of the paths are conductors 2 and 9 strapping the grids and anodes respectively. The feedback voltage is obtained from impedance 11 connected in the lead common to both cathodes of the output stage. The amplifier is connected between source and load by means of transformers 12 and 13. Power supply, decoupling and other auxiliary circuits have been omitted for clarity. For the same reasons triode valves are shown whereas in actual fact multi-electrode valves are used.

It is to be understood that the foregoing description of specific examples of this invention is not to be considered as a limitation of its scope.

What I claim is:

1. An amplifier comprising:
a source of input signals;
means for dividing said signals;
at least two amplifying paths connected in parallel with each other to receive said divided signals;
each path having an input and an output and at least two stages of amplification;
a feedback path connecting the output to the input of both of the amplifying paths; and
a bridging impedance connecting an interstage coupling circuit in one amplifying path to a corresponding coupling circuit in another amplifying path;

said bridging impedance serving to divert all of said signals to a single amplifying path in the event of failure in the parallel amplifying path.

2. An amplifier substantially as claimed in claim 1, in which:

the amplifying stages include electron tubes.

3. An amplifier substantially as claimed in claim 1, in which:

the common feedback path provides negative feedback over all the amplifying stages.

References Cited

UNITED STATES PATENTS

| | | | |
|---|---|---|---|
| 2,269,518 | 1/1942 | Chrieix et al. | 330—84 |
| 3,176,240 | 3/1965 | Sante. | |

ROY LAKE, *Primary Examiner*.

J. B. MULLINS, *Assistant Examiner*.